United States Patent
Crouse, II et al.

(10) Patent No.: US 6,829,572 B2
(45) Date of Patent: Dec. 7, 2004

(54) METHOD AND SYSTEM FOR EFFICIENTLY OVERRIDING ARRAY NET VALUES IN A LOGIC SIMULATOR MACHINE

(75) Inventors: Daniel R. Crouse, II, Hyde Park, NY (US); Harrell Hoffman, Austin, TX (US)

(73) Assignee: Internatinal Business Machines Corporation, Armonk, NY (US)

( * ) Notice: Subject to any disclaimer, the term of this patent is extended or adjusted under 35 U.S.C. 154(b) by 707 days.

(21) Appl. No.: 09/732,272

(22) Filed: Dec. 7, 2000

(65) Prior Publication Data

US 2002/0072890 A1 Jun. 13, 2002

(51) Int. Cl.[7] .............................................. G06F 17/50
(52) U.S. Cl. ............................ 703/15; 703/14; 703/19; 703/21; 703/22; 703/24; 710/21
(58) Field of Search .............................. 703/14, 21, 22, 703/15, 19, 24; 710/21

(56) References Cited

U.S. PATENT DOCUMENTS

| | | | | |
|---|---|---|---|---|
| 4,862,347 A | * | 8/1989 | Rudy ............................ | 703/14 |
| 5,220,512 A | * | 6/1993 | Watkins et al. ................ | 716/11 |
| 5,278,841 A | * | 1/1994 | Myers ......................... | 714/717 |
| 5,327,361 A | * | 7/1994 | Long et al. ..................... | 703/15 |
| 5,442,640 A | * | 8/1995 | Bardell et al. ............... | 714/718 |
| 5,548,785 A | * | 8/1996 | Fogg, Jr. et al. ............... | 710/21 |
| 5,802,303 A | * | 9/1998 | Yamaguchi .................. | 709/224 |
| 6,087,967 A | * | 7/2000 | Budnik et al. ................. | 341/63 |
| 6,205,572 B1 | * | 3/2001 | Dupenloup ..................... | 716/5 |
| 2002/0072888 A1 | * | 6/2002 | Hoffman | |

* cited by examiner

*Primary Examiner*—Thai Phan
*Assistant Examiner*—Herng-der Day
(74) *Attorney, Agent, or Firm*—Duke W. Yee; Robert M. Carwell; Wayne P. Bailey

(57) ABSTRACT

A method and system are described for efficiently overriding a value of a net in an array during execution of a test routine. The logic simulator machine is simulating a logic design which includes the array and multiple nets. A current value of the net is set equal to an override value. A normal update to the array is permitted to occur during execution of a single cycle of the test routine. A determination is then made regarding whether the override value is still stored in the array for the particular net. If the override value is not still stored in the array for this net, normal updates to the array are prohibited during a single cycle of the test routine. During this cycle of the test routine, the override value is then again stored in the net as the current value of the net. This override value is thus made available to be read during this cycle of the test routine while writes to the array are disabled. Normal updates are then again permitted to occur to the array in subsequent cycles of the test routine.

6 Claims, 5 Drawing Sheets

METHOD AND SYSTEM FOR EFFICIENTLY OVERRIDING ARRAY NET VALUES IN A LOGIC SIMULATOR MACHINE

BACKGROUND OF THE INVENTION

1. Technical Field

The present invention relates in general to apparatus and methods in a logic simulator machine. More particularly, the present invention provides apparatus and methods in a logic simulator machine for efficiently overriding array net values.

2. Description of Related Art

Logic circuits in computer systems and related products have become increasingly large and complex. As a result, the initial design and fabrication have become increasingly more lengthy and costly. Although many efforts are made to eliminate any errors, it is no longer feasible to test the design only after the circuit has been fabricated. Accordingly, in recent years there has been increasing effort in design verification using computer modeling of the logic circuits before the circuit is actually embodied in hardware. The errors being referred to here are those produced by the interaction of logic circuits which are assumed to be operating correctly as separate entities but which are producing poor or incorrect results when operating together.

Logic technologies such as very large scale integrated circuits provide significant improvements in cost, performance, and reliability. However, they have disadvantages in that their fault diagnosis is more difficult than previous technologies and their engineering rework cycles needed to correct faults in logic design are greatly lengthened. These disadvantages exact great economic penalties for design errors and omissions and place a great emphasis on the goal of completely verifying designs in advance of engineering models.

Simulation has become a central part of verification methodology for circuit design. Applications span a wide spectrum, from early specifications to explore different architectural possibilities to the final stages of manufacturing test generation and fault coverage evaluation. For a long time, computer programs for use on a general purpose computer have been known which simulate such logic circuits. In these systems, the software program is run on any suitable general purpose computer. A model of the logic design is created. Test software programs may then be developed and executed using the model to analyze the operation of the logic design. However, as the number of gates on a single chip have reached into the range of hundreds of thousands to millions, these purely software simulators have required excessive amounts of computer time.

One approach used to overcome the excessive resource problem for full system simulation has been to build a hardware model of the design, essentially by hand wiring circuit boards with discrete components. Once wired, the circuit very quickly can emulate the desired circuit. A hardware emulator is a device which physically takes the place of the device to be emulated. A logic simulator machine, described below, could also act as a hardware emulator when the logic simulator machine is executing a model of the design if the appropriate wiring is attached to the logic simulator machine which will permit it to be physically coupled to other devices. However, a hardware model itself is costly and time consuming to build.

Another approach, which has found widespread acceptance, is a specialized logic simulator machine. These logic simulator machines as also sometimes called hardware accelerators. There are numerous logic simulation machines in existence for simulation, with different capacity, performance, and applications. These logic simulation machines range from small systems to significantly larger machines for simulating millions of gates. The term "logic simulator machine" as used herein will mean a hardware-based machine, and not a software-based simulation engine as described above.

One such logic simulator machine is described by U.S. Pat. No. 4,306,286 issued Dec. 15, 1981 to Cocke et al. This patent is herein incorporated by reference. The purpose of the logic simulator machine is to detect design errors in a simulated logic and enable the logic designer to correct the errors before the manufacture of the design.

The logic simulator machine described by Cocke et al. comprises a plurality of parallel basic processors which are interconnected through an inter-processor switch. The inter-processor switch provides communication not only among the basic processors which are the computing engine of the logic simulator machine, each simulating the individual gates of a portion of a logic model in parallel, but also between them and a control processor which provides overall control and input/output facilities of the logic simulator machine through a host computer to which the control processor is attached. Each basic processor contains the current state information for only the set of gates that is being simulated by that processor. When a basic processor simulates a gate whose input includes a connection to the output of a gate being simulated by a different processor, the state information for the gate is transferred over the inter-processor switch.

A representation of a logic design is first created in which Boolean gates, such as AND or OR gates, are used. A model of this representation is then built which may then be executed by the logic simulator machine. Test routines to test the design then may be executed using the model of the design which is being executed by the logic simulator machine.

In order to test a circuit design using a logic simulator machine, a model of the circuit is built. A test routine then may be executed using the model being executed by the logic simulator machine.

It may be useful when testing a circuit design to override one or more nets which are included in an array included in the logic design while the test routine is being executed. It is more difficult to override an array net because the logic which drives the array drives all of the nets of the array, and not just a specific net. Therefore, it is difficult to modify the model to only override only the single net or nets that are required to be overridden.

In the prior art when a software simulator is used, a test engineer could patch the model to force a particular net to be equal to an override value.

Therefore, a need exists for a method and system for efficiently overriding an array net during execution of a test routine by a logic simulator machine.

SUMMARY OF THE INVENTION

A method and system are described for efficiently overriding a value of a net in an array during execution of a test routine. The logic simulator machine is simulating a logic design which includes the array and multiple nets. A current value of the net is set equal to an override value. A normal update to the array is permitted to occur during execution of a single cycle of the test routine. A determination is then made regarding whether the override value is still stored in the array for the particular net. If the override value is not still stored in the array for this net, normal updates to the array are prohibited during a single cycle of the test routine. During this cycle of the test routine, the override value is then again stored in the net as the current value of the net. This override value is thus made available to be read during this cycle of the test routine while writes to the array are disabled. Normal updates are then again permitted to occur to the array in subsequent cycles of the test routine.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

A preferred embodiment of the present invention and its advantages are better understood by referring to FIGS. 1–5 of the drawings, like numerals being used for like and corresponding parts of the accompanying drawings.

The present invention is a method and system in a logic simulator machine for overriding a value of a net in an array during execution of a test routine while the logic simulator machine is simulating a logic design. The logic design includes the array and other nets. The current value of the net is set equal to an override value. A single cycle of the test routine is then executed allowing a normal update to the array during this cycle. The value of the net is then examined after the single cycle of the test routine. A determination is made regarding whether the current value of the net is still set equal to the override value. If a determination is made that the current value of the net was changed during the single cycle of the test routine to a value which is not the override value, updates to the array are then disabled.

When the model of the logic design is built, a WRITE DISABLE input is added to each array in the design. Updates to an array are disabled by setting the WRITE DISABLE input into the array. When the WRITE DISABLE input is set, the array cannot be written into. When the WRITE DISABLE is cleared, the array can again be written into.

While the array is disabled by setting its WRITE DISABLE input, the current value of the net is then again set equal to the override value. Another single cycle of the test routine is executed while updates to the array are disabled. This then makes the override value available to be read as the current value of the net while writes to the array are disabled. Thereafter, updates to the array are then again enabled by clearing the array's WRITE DISABLE input.

Figure 1:
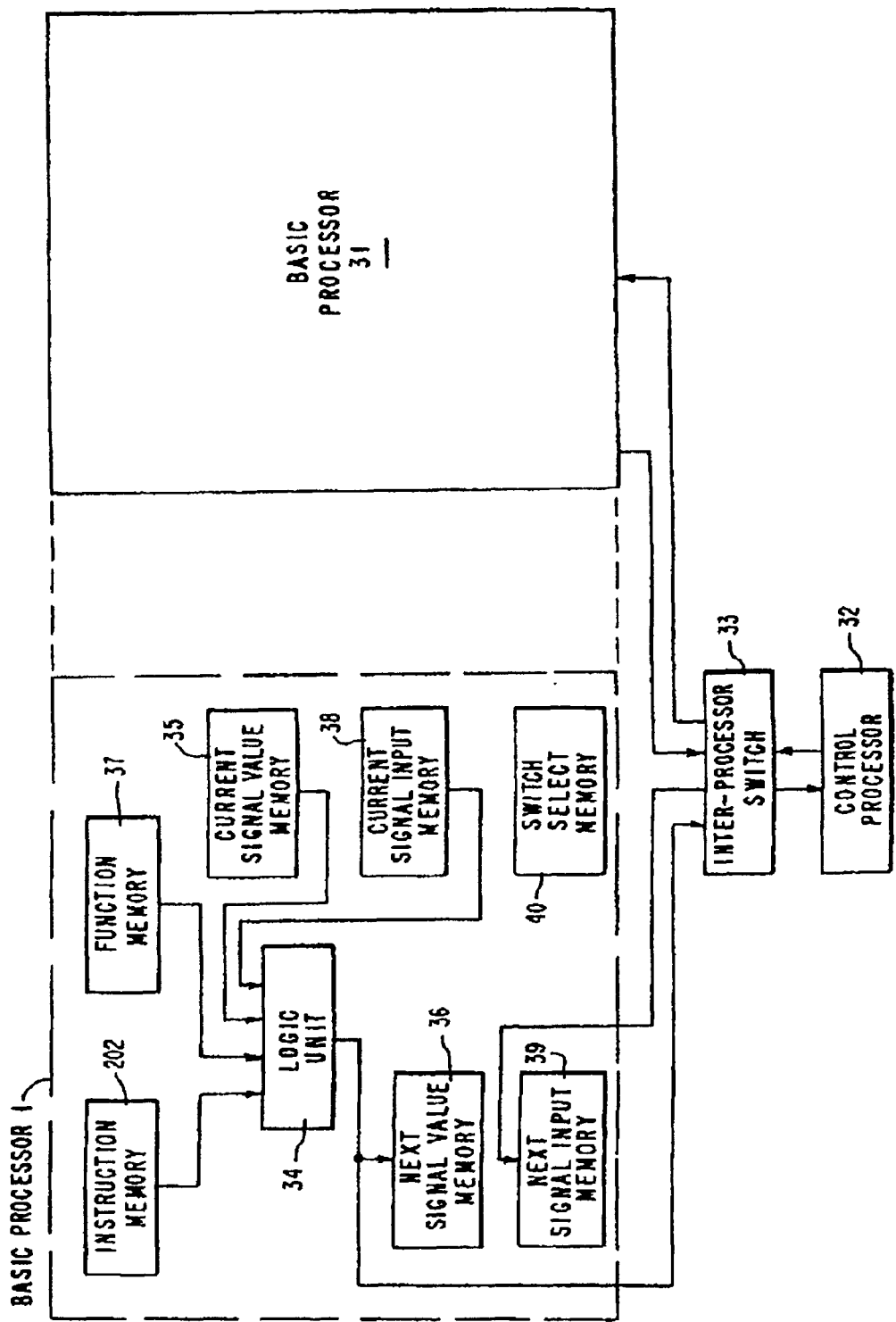
FIG. 1 depicts a logic simulator machine which is capable of executing the present invention.

As illustrated in FIG. 1, each basic processor such as processor 1 has a plurality of internal memories with a logic unit 34 connecting them. Two of these memories are two identical logic data memories which alternately assume one of two roles; that of the current signal value memory 35 and that of the next signal value memory 36. The current and next signal value memories 35 and 36 contain logic signal representations. The data in current signal value memory 35 are the logic signal values that are currently present in simulation. The logic unit updates those values, placing the results in the next signal value memory.

The process of updating all of the signal values is called a major cycle. The simulation proceeds in units of major cycles, each of which corresponds to a single gate delay. At the conclusion of each major cycle, the logic simulator machine may halt. If it does not, the former next signal value memory is designated to be the current signal value memory and another major cycle is performed.

Another component of the basic processor of FIG. 1 is the instruction memory 202. The logic unit 34 uses the instruction memory 202 in computing updated logic signal values.

Each logic simulator machine instruction contains a function code field, referred to as the opcode, and address fields. The function code specifies the logic function to be performed, e.g., AND, NOR, XOR, etc. The address fields specify input connections to a gate.

To perform a major cycle, the logic unit 34 sequences through instruction memory 202 in address order, executing each instruction by computing the specified logic function on the specified address fields from current signal memory. The result of each instruction is placed in next signal value memory 36 at the address equal to the instruction's address in instruction memory. Thus, an instruction (representing a gate) at address X has its result (representing the gate's output) placed at next signal value memory 36 address X. The gate's output one gate delay earlier resides at current signal value memory 35 address X.

The logic functions specified in the logic simulator machine instructions are defined by the contents of another basic processor memory, the function memory 37 shown in FIG. 1. Each distinct logic function used in a basic processor during a simulation is defined by the contents of a single location in function memory 37. The function code of each instruction is stored at an address in function memory 37.

Figure 2:
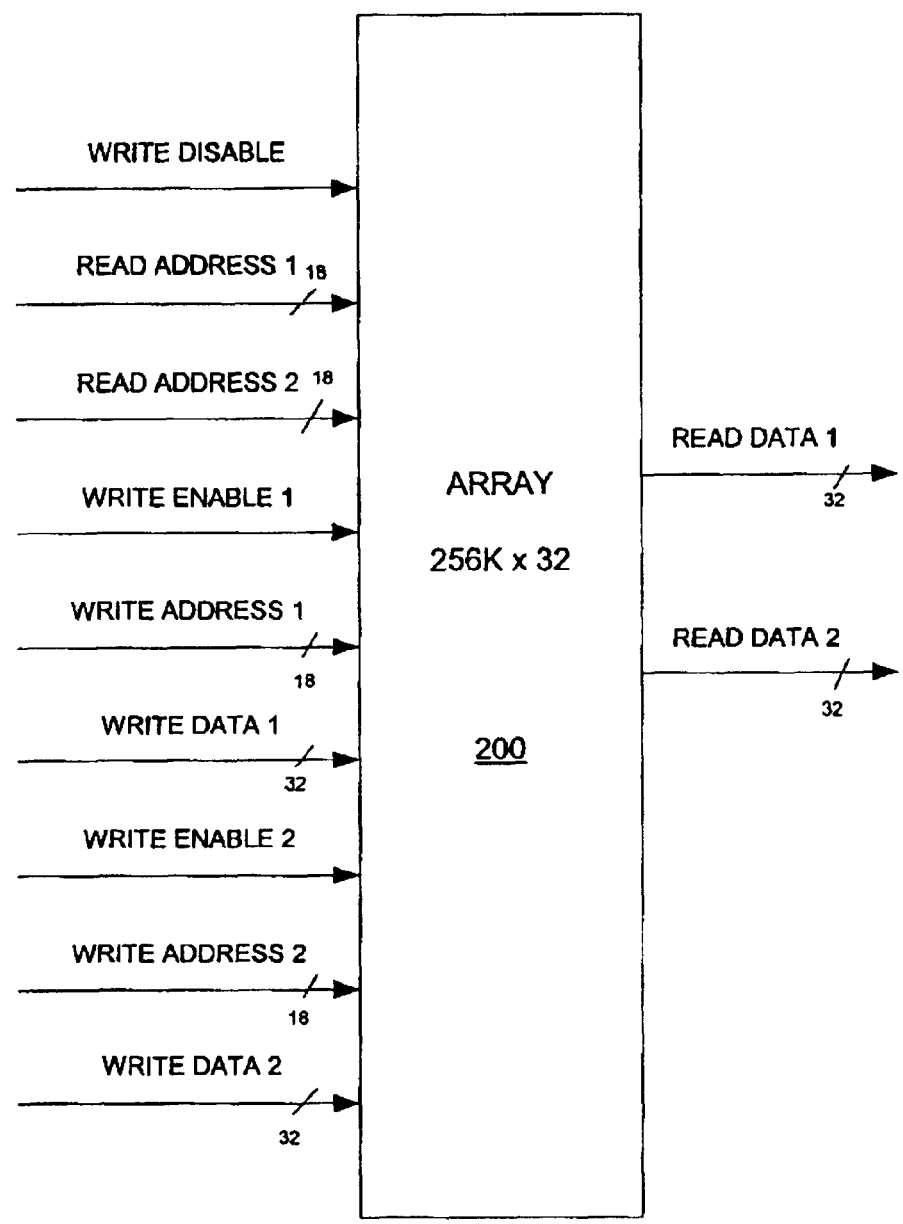
FIG. 2 illustrates a block diagram of an array having a WRITE DISABLE input in accordance with the present invention.

FIG. 2 illustrates a block diagram of an array 200 having a WRITE DISABLE input in accordance with the present invention. When an array is included within a model to be executed by a logic simulator machine, an array does not typically include a WRITE DISABLE input. In the present invention, at model build time, a WRITE DISABLE input will be included for each array.

When the WRITE DISABLE input is set, such as by setting the input equal to a logical one, the array will not be able to be written to. Thus, when the WRITE DISABLE input is set, normal updates to the array will not be permitted to occur.

When the WRITE DISABLE input is cleared, such as by setting the input equal to a logical zero, the array will be able to be written to. Thus, when the WRITE DISABLE input is cleared, normal updates to the array will be permitted to occur.

Figure 3:
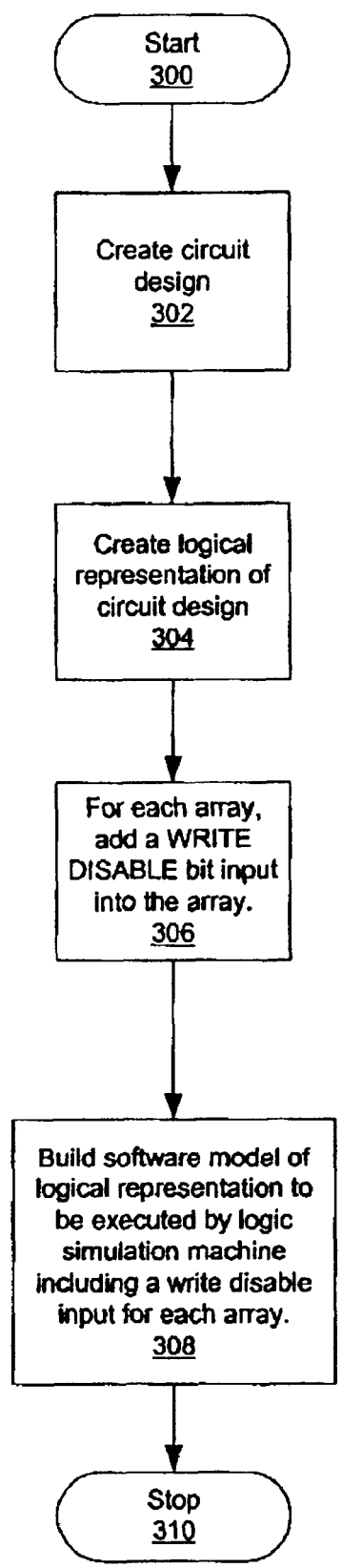
FIG. 3 depicts a high level flow chart which depicts building a model including a WRITE DISABLE input for each array included in the model used to execute a test routine utilizing a logic simulator machine according to the present invention.

FIG. 3 depicts a high level flow chart which depicts building a model including a WRITE DISABLE input for each array included in the model used to execute a test routine utilizing a logic simulator machine in accordance with the present invention. The process starts as illustrated by block 300 and thereafter passes to block 302 which depicts creating a circuit design. This circuit design is to be tested using logic simulator machine 1. Next, block 304 illustrates creating a logical representation of the circuit design. The process then passes to block 306 which depicts adding a WRITE DISABLE input into each array in the logical representation. Thereafter, block 308 illustrates building a model of the logical representation including a WRITE DISABLE input into each array. The test routine will be executed by the logic simulator machine using this model. The process then terminates as illustrated by block 310.

Figure 4:
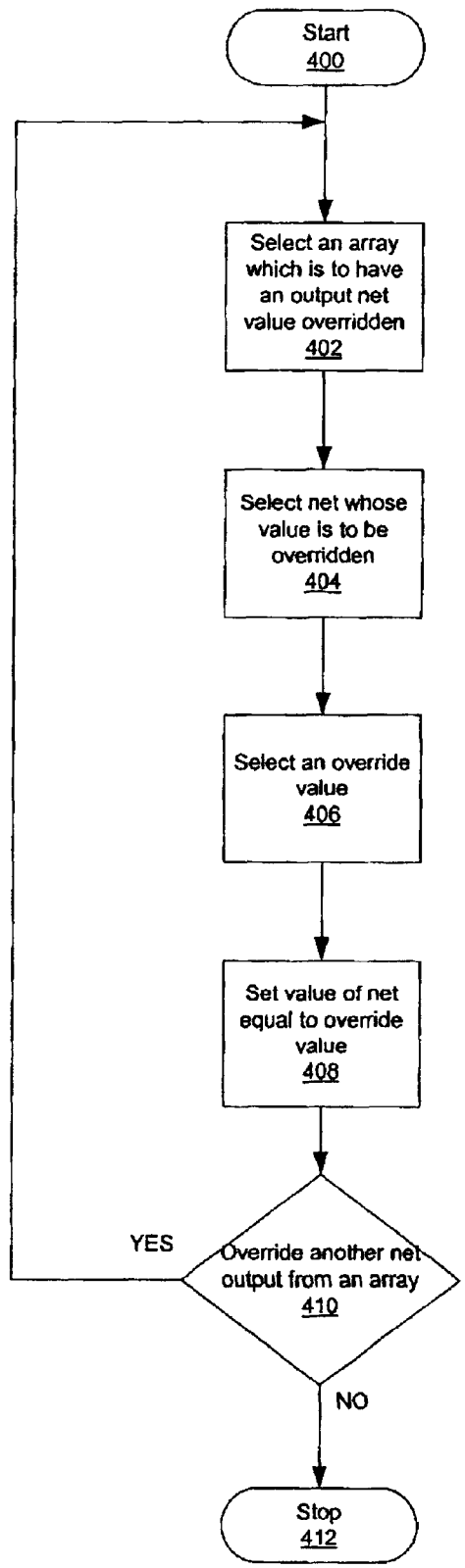
FIG. 4 depicts a high level flow chart which illustrates overriding net values included in an array in accordance with the present invention.

FIG. 4 illustrates a high level flow chart which illustrates overriding net values in an array in accordance with the present invention. The process starts as depicted by block 400 and thereafter passes to block 402 which illustrates selecting an array which is to have a net value overridden. Next, block 404 depicts selecting a net whose value is to be overridden. Thereafter, block 406 illustrates selecting an override value. Block 408, then, depicts setting the value of the net equal to the override value. Next, block 410 illustrates a determination of whether or not another net value in an array is to be overridden. If a determination is made that another net value in an array is to be overridden, the process passes to block 402. Referring again to block 410, if a determination is made that no other net values are to be overridden, the process terminates as depicted by block 412.

Figure 5:
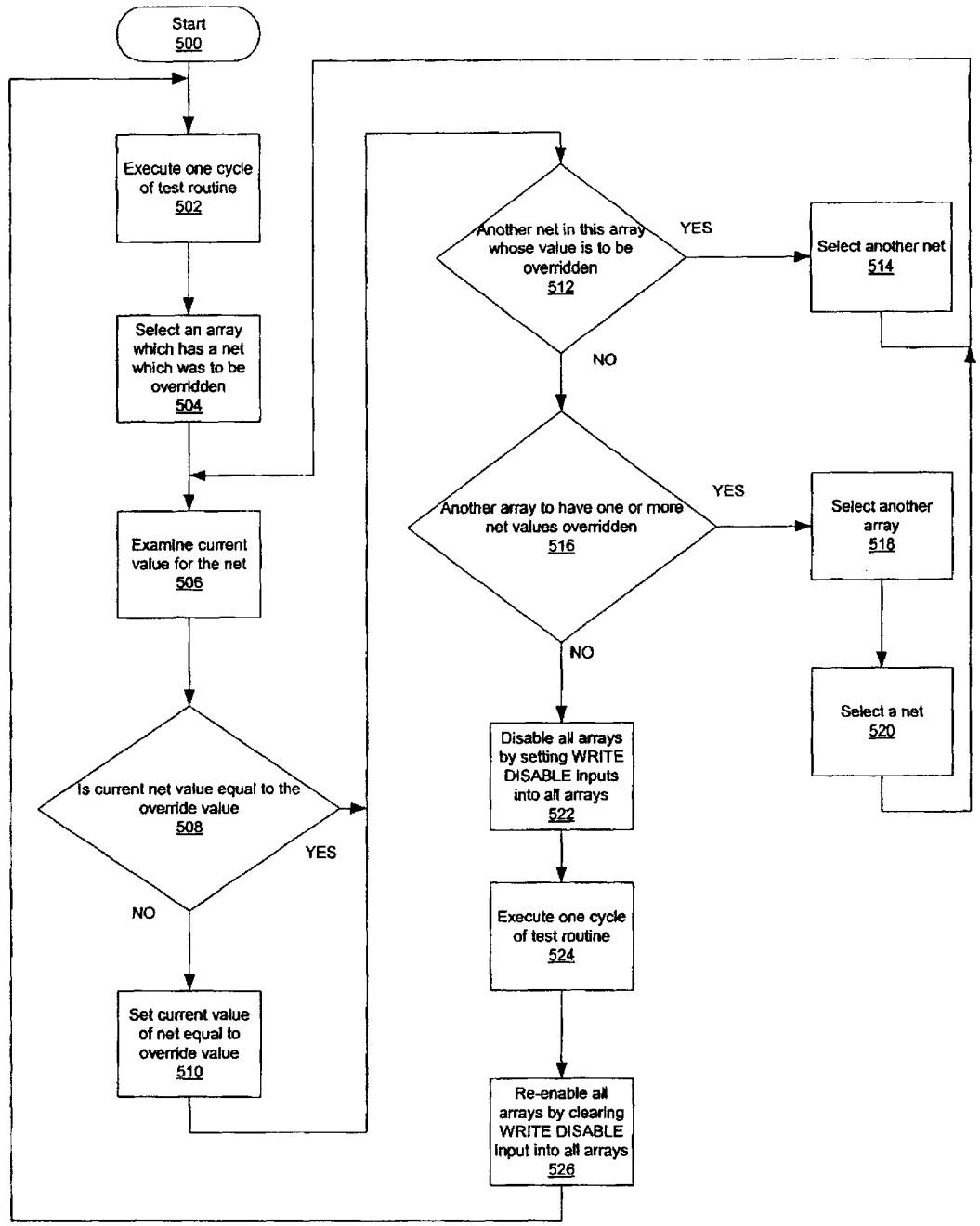
FIG. 5 depicts a high level flow chart which depicts executing a test routine wherein a net included in an array is overridden during execution in accordance with the present invention.

FIG. 5 depicts a high level flow chart which depicts executing a test routine wherein a net included in an array is overridden during execution in accordance with the present invention. The process starts as illustrated by block 500 and thereafter passes to block 502 which depicts executing one cycle of the test routine. Next, block 504 illustrates selecting an array which has a net which was to be overridden during the execution of this cycle of the test routine. Block 506, then, depicts examining the current value for the net.

The process passes to block 508 which illustrates a determination of whether or not the current value for the net is equal to the override value. The value of the net was set equal to the override value prior to the execution of this cycle of the test routine. Block 508 depicts a determination of whether or not the execution of this cycle of the test routine changed the current value of the net from the override value to a different value. If the execution of the cycle of the test routine did not change the value of the net, i.e. the current value of the net is equal to the override value, the process passes to block 512. Referring again to block 508, if a determination is made that the execution of the cycle of the test routine did change the value of the net, i.e. the current value of the net is not equal to the override value, the process passes to block 510.

Block 510 depicts setting the current value of the net equal to the override value. The process then passes to block 512 which illustrates a determination of whether or not there is another net in this array whose value is to be overridden. If a determination is made that there is another net, the process passes to block 514 which depicts selecting another net. The process then passes back to block 506.

Referring again to block 512, if a determination is made that there is no other net in this array whose value is to be overridden, the process passes to block 514 which illustrates a determination of whether or not any other arrays include nets whose values are to be overridden. If a determination is made that another array has a net whose value is to be overridden, the process passes to block 518. Block 518 depicts selecting another array. Next, block 520 illustrates selecting a net within that array whose value is to be overridden. The process then passes back to block 506.

Referring again to block 516, if a determination is made that there are no other arrays which include a net whose value is to be overridden, the process passes to block 522. Block 522 illustrates disabling writing to the array by setting the WRITE DISABLE input to the array equal to a logical one. When the WRITE DISABLE input into the array is equal to a logical one, the array cannot be written into. Therefore, the array will keep its previous values during execution of the test routine while the WRITE DISABLE input is set, i.e. equal to a logical one. When the WRITE DISABLE input into the array is equal to a logical zero, the array can be written into. The values of the array may change during execution of the test routine when the WRITE DISABLE input is set equal to a logical zero. Thus, by setting the particular net equal to the override value, disabling the array, and executing a single cycle of the test routine, all of the previous values of the array for the other nets, and the override value for the selected are made available to be read during the cycle.

The process then passes to block 524 which depicts executing one cycle of the test routine while the WRITE DISABLE is set to a logical one. Therefore, one cycle of the test routine is executed while the array is disabled. The process then passes to block 526 which illustrates re-enabling the array to be able to be written to be clearing the WRITE DISABLE Input, i.e. by setting the WRITE DISABLE input equal to a logical zero. The process then passes back to block 502. The process then passes back to block 502.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a logic simulator machine for overriding a value of a net in an array during execution of a test routine while said logic simulator machine is simulating a logic design, said logic design including said array, said method comprising the steps of:

setting a current value of said net equal to an override value;

permitting a normal update to said array to occur during execution of said test routine;

determining whether a current value of said net is said override value;

in response to said current value not being said override value, setting a current value of said net canal to said override value;

building a model of said logic design to be simulated utilizing said logic simulator machine; and inserting a write disable input into said array in said model during said step of building, wherein updates to said array during execution of a cycle of said test routine are permitted when said write disable input is cleared and further wherein updates to said array during execution of said cycle of said test routine are prohibited when said write disable is set.

2. The method according to claim 1, further comprising the step of executing only one cycle of said test routine.

3. A method in a logic simulator machine for overriding a value of a net in an array during execution of a test routine while said logic simulator machine is simulating a logic design, said logic design including said array, said method comprising the steps of:

setting a current value of said net equal to en override value;

permitting a normal update to said array to occur during execution of said test routine;

determining whether a current value of said net is said override value; and in response to said current value not being said override value, setting a current value of said net equal to said override value, wherein said step of in response to a current value of said net not being said override value, setting a current value of said net equal to said override value further comprises the steps of:

examining a current value of said net after a completion of said execution of only one cycle of said test routine;

determining whether a current value is equal to said override value; and in response to a determination that said current value is not equal to said override value:

setting a current value of said net equal to said override value;

disabling an ability to write to said array by setting a write enable input of said array, wherein updates to said array are permitted when said write disable input is cleared and further wherein updates to said array are prohibited when said write disable is set;

executing only one cycle of said test routine during which said override value of said net is available to be read; and re-enabling said ability to write to said array by clearing said write enable input, wherein normal updates are again permitted to said array.

4. A logic simulator machine for overriding a value of net in an array during execution of a test routine while said logic simulator machine is simulating a logic design, said logic design including said array, comprising:

said net having a current value equal to an override value;

said logic simulator machine executing said test routine and permitting a normal update to said array to occur during said execution of said test routine;

means for determining whether a current value of said net is said override value;

in response to said current value not being said override value, means for setting a current value of said net equal to said override value;

a model built of said logic design to be simulated utilizing said logic simulator machine; and a write disable input inserted into said array in said model during building, wherein updates to said array during execution of a cycle of said test routine are permitted when said write disable input is cleared and further wherein updates to said array during execution of said cycle of said test routine are prohibited when said write disable is set.

5. The logic simulator machine according to claim 4, further comprising said logic simulator machine executing only one cycle of said test routine.

6. A logic simulator machine for overriding a value of a net in an array during execution of a test routine while said logic simulator machine is simulating a logic design, said logic design including said array, comprising:

said net having a current value equal to an override value;

said logic simulator machine executing said test routine and permitting a normal update to said array to occur during said execution of said test routine;

means for determining whether a current value of said net is said override value; and in response to said current value not being said override value, means for setting a current value of said net equal to said override value, wherein said means responsive to a current value of said net not being said override value, for sewing a current value of said net equal to said override value further comprises:

means for examining a current value of said net after a completion of said execution of only one cycle of said test routine;

means for determining whether a current value is equal to said override value; and means response to a determination that said current value is not equal to said override value:

for setting a current value of said net equal to said override value;

for disabling an ability to write to said array by setting a write enable input of said array, wherein updates to said array are permitted when said write disable input is cleared and further wherein updates to said array are prohibited when said write disable is set;

for executing only one cycle of said test routine during which said override value of said net is available to be read; and for re-enabling said ability to write to said array by clearing said write enable input, wherein normal updates are again permitted to said array.

* * * * *

UNITED STATES PATENT AND TRADEMARK OFFICE
CERTIFICATE OF CORRECTION

PATENT NO. : 6,829,572 B2
DATED : December 7, 2004
INVENTOR(S) : Crouse, II et al.

It is certified that error appears in the above-identified patent and that said Letters Patent is hereby corrected as shown below:

Column 7,
Line 14, after "said net" delete "canal" and insert -- equal --.
Line 32, after "equal to" delete "en" and insert -- an --.
Line 63, after "value of" insert -- a --.

Column 8,
Line 38, after "for" delete "sewing" and insert -- setting --.

Signed and Sealed this

Fourteenth Day of February, 2006

JON W. DUDAS
*Director of the United States Patent and Trademark Office*